US008987733B2

(12) United States Patent
Park et al.

(10) Patent No.: US 8,987,733 B2
(45) Date of Patent: Mar. 24, 2015

(54) ARRAY SUBSTRATE FOR FLEXIBLE DISPLAY DEVICE

(71) Applicants: Sung-Un Park, Yongin (KR); Dong-Ho Kim, Yongin (KR)

(72) Inventors: Sung-Un Park, Yongin (KR); Dong-Ho Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/781,954

(22) Filed: Mar. 1, 2013

(65) Prior Publication Data

US 2014/0097430 A1 Apr. 10, 2014

(30) Foreign Application Priority Data

Oct. 9, 2012 (KR) .......................... 10-2012-0112081

(51) Int. Cl.
*H01L 27/12* (2006.01)

(52) U.S. Cl.
CPC ................................ *H01L 27/1218* (2013.01)
USPC .......................................................... 257/48

(58) Field of Classification Search
CPC .................................................. H01L 27/1218
USPC ................................. 257/40, 48, 59; 349/50
See application file for complete search history.

(56) References Cited

U.S. PATENT DOCUMENTS

| 5,717,476 | A | * | 2/1998 | Kanezawa | ..................... 349/149 |
| 7,968,882 | B2 | | 6/2011 | Lee et al. | |
| 2008/0068309 | A1 | * | 3/2008 | Kwak et al. | ...................... 345/82 |
| 2010/0309101 | A1 | * | 12/2010 | Kanegae et al. | ................ 345/76 |
| 2011/0037095 | A1 | * | 2/2011 | Park et al. | ...................... 257/100 |
| 2011/0133637 | A1 | * | 6/2011 | Ota | ................ 313/504 |
| 2011/0260180 | A1 | * | 10/2011 | Kuranaga et al. | ............... 257/88 |
| 2011/0291098 | A1 | * | 12/2011 | Hayafuji | ......................... 257/59 |

FOREIGN PATENT DOCUMENTS

| KR | 10-2009-0121894 A | 11/2009 |
| KR | 10-2011-0133881 A | 12/2011 |

\* cited by examiner

*Primary Examiner* — Marcos D. Pizarro
*Assistant Examiner* — Sue Tang
(74) *Attorney, Agent, or Firm* — Lee & Morse, P.C.

(57) ABSTRACT

An array substrate for a flexible display device, the array substrate including a mother substrate, a plurality of display units separated on the mother substrate, in which the plurality of display units include display regions that display images and non-display regions that extend from the display regions to edges of each of the plurality of display units, respectively, encapsulation units covering the display regions of the plurality of display units, respectively, a plurality of testing wires in a wire region between adjacent display units from among the plurality of display units, in which the plurality of testing wires are electrically connected to each of the plurality of display units, and crack preventing units in the non-display regions between edges of the encapsulation units and the edges of each of the plurality of display units, respectively.

17 Claims, 5 Drawing Sheets

ARRAY SUBSTRATE FOR FLEXIBLE DISPLAY DEVICE

CROSS-REFERENCE TO RELATED PATENT APPLICATION

This application claims priority under 35 U.S.C. §119 to Korean Patent Application No. 10-2012-0112081, filed on Oct. 9, 2012, in the Korean Intellectual Property Office, and entitled: "Array Substrate For Flexible Display Device," the disclosure of which is incorporated herein in its entirety by reference.

BACKGROUND

Flat display devices are widely classified into a light-emitting type display device and a light-receiving type display device. Examples of the light-emitting type display device include an organic light-emitting display device (OLED), a plasma display panel (PDP), a flat cathode ray tube (FCRT), a vacuum fluorescent display panel (VFD), a light-emitting diode (LED) panel, and the like. Examples of the light-receiving type display device include a liquid crystal display (LCD) panel and the like.

SUMMARY

Embodiments may be realized by providing an array substrate for a flexible display device, the array substrate including a mother substrate, a plurality of display units formed separately on the mother substrate, in which each of the plurality of display units includes a display region that displays an image and a non-display region that extends from the display region to an edge of each of the plurality of display units, an encapsulation unit covering the display region of each of the plurality of display units, and a plurality of testing wires formed in a wire region between adjacent display units from among the plurality of display units, and that are electrically connected to each of the plurality of display units. A crack preventing unit is in the non-display region between an edge of the encapsulation unit and an edge of each of the plurality of display units.

The crack preventing unit may be formed as at least one continuous straight line, at least one continuous curved line, a plurality of intermittent straight lines that are separated from each other or overlap with each other, or a plurality of intermittent curved lines that are separated from each other or overlap with each other. The crack preventing unit may be formed of a conductive material.

A plurality of cutting lines may be on the mother substrate so as to individually divide the plurality of display units along edges of the plurality of display units, and the plurality of cutting lines may correspond to the edges of the plurality of display units. The plurality of cutting lines may be separated from the plurality of testing wires.

The array substrate may further include a protective film that covers all of the plurality of display units, the encapsulation unit, the plurality of testing wires, and the crack preventing unit on the mother substrate. Each of the plurality of display units may include a flexible substrate, a thin-film transistor (TFT) on the flexible substrate, in which the TFT may include a semiconductor active layer, a gate electrode, source and drain electrodes, and a plurality of insulating layers that insulate the gate electrode, the source and drain electrodes, and the semiconductor active layer, and an organic light-emitting device (OLED) that is connected to the TFT, in which the OLED may include a first electrode, a second electrode, and an organic layer between the first electrode and the second electrode.

The crack preventing unit may be on at least one insulating layer from among the plurality of insulating layers. A plurality of cutting lines may be formed at edges of each of the plurality of display units so as to individually divide the plurality of display units, and the plurality of cutting lines may be between the crack preventing unit and the plurality of testing wires.

The plurality of insulating layers may include a first insulating layer corresponding to a buffer layer that is on the flexible substrate, a second insulating layer corresponding to a gate insulating layer that covers the semiconductor active layer on the first insulating layer, and a third insulating layer corresponding to an interlayer insulating layer that covers the gate electrode on the second insulating layer.

The gate electrode may be in a display region of the second insulating layer, and at least one crack preventing unit may be in a non-display region between an encapsulation unit and a plurality of cutting lines. The source and drain electrodes may be in a display region of the third insulating layer, and at least one crack preventing unit may be in a non-display region between an encapsulation unit and a plurality of cutting lines.

The source and drain electrodes may be in a display region of the third insulating layer, and at least one crack preventing unit may be in a non-display region between an encapsulation unit and a plurality of cutting lines so as to fill a contact hole that penetrates through the second insulating layer and the third insulating layer.

Embodiments may also be realized by providing an array substrate for a flexible display device, the array substrate including a flexible substrate, a plurality of display units formed separately on the flexible substrate, in which each of the plurality of display units includes a display region that is covered by an encapsulation unit and that displays an image and a non-display region that extends from the display region, and a plurality of testing wires formed in a wire region between adjacent display units from among the plurality of display units, and is electrically connected to each of the plurality of display units, in which at least one crack preventing unit is in the non-display region between an edge of the encapsulation unit and an edge of each of the plurality of display units, and a plurality of cutting lines are between the at least one crack preventing unit and the plurality of testing wires so as to individually divide the plurality of display units.

Embodiments may also be realized by providing an array substrate for a flexible display device, the array substrate including a flexible substrate, a plurality of display units formed separately on the flexible substrate, in which each of the plurality of display units includes a display region that is covered by an encapsulation unit and that displays an image and a non-display region that extends from the display region, and a plurality of testing wires formed in a wire region between adjacent display units from among the plurality of display units, in which a plurality of cutting lines are formed along edges of the plurality of display units so as to individually divide the plurality of display units while the plurality of cutting lines do not overlap with the plurality of testing wires.

A crack preventing unit may be between the encapsulation unit and the plurality of cutting lines. The crack preventing unit may surround the encapsulation unit and may be formed of a conductive material.

BRIEF DESCRIPTION OF THE DRAWINGS

Features will become more apparent to those of ordinary skill in the art by describing in detail exemplary embodiments thereof with reference to the attached drawings in which.

DETAILED DESCRIPTION

Figure 1:
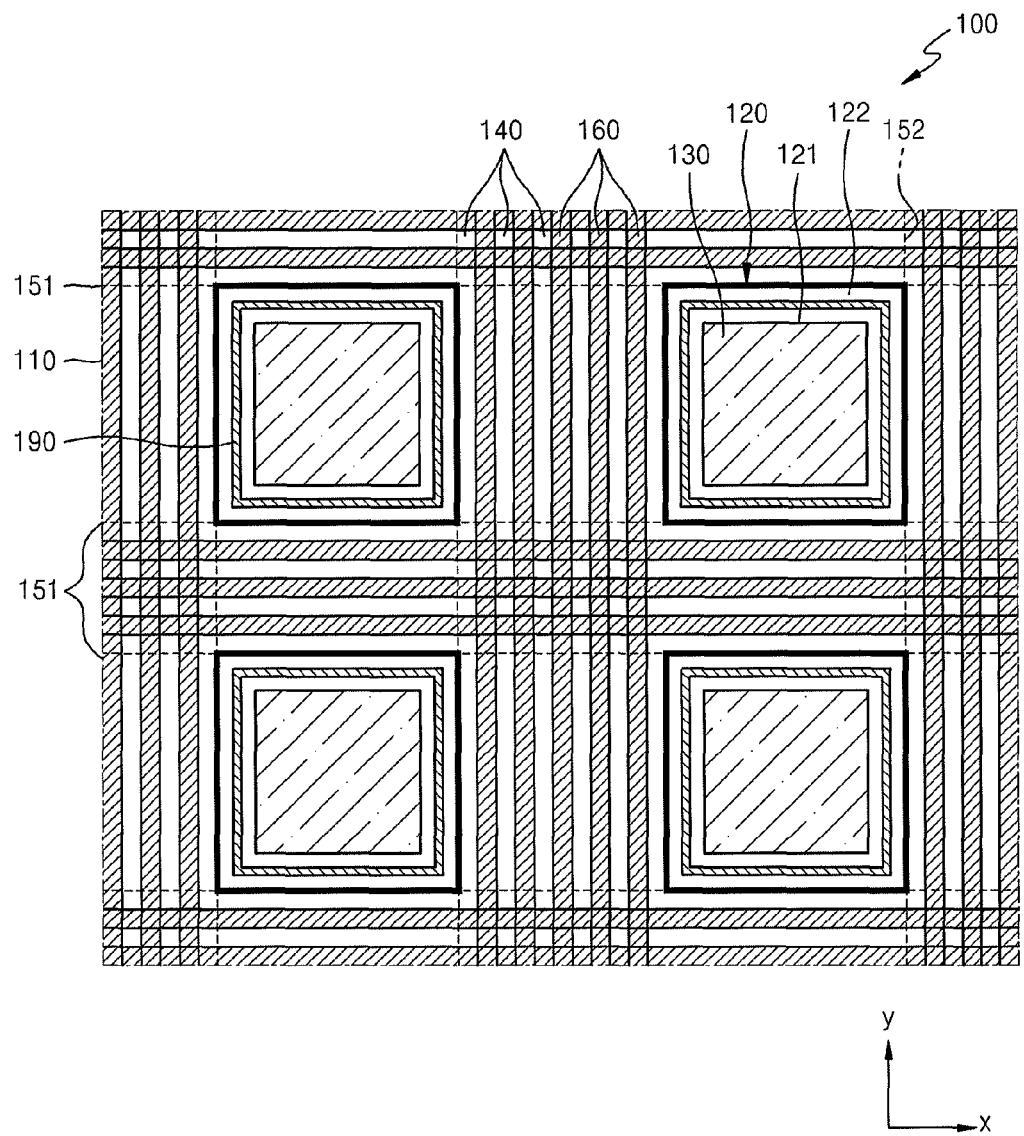
FIG. 1 illustrates an array substrate for a flexible display device according to an exemplary embodiment.

Hereinafter, embodiments will be described in detail by explaining exemplary embodiments with reference to the attached drawings. Embodiments, however, be embodied in many different forms, and should not be construed as being limited to the embodiments set forth herein. Thus, the embodiments may include all revisions, equivalents, or substitutions which are included in the concept and the technical scope. In the description, certain detailed explanations of related art are omitted when it is deemed that they may unnecessarily obscure the essence of the exemplary embodiments.

While such terms as "first", "second", etc., may be used to describe various components, such components must not be limited to the above terms. The above terms are used only to distinguish one component from another.

The terms used in the present specification are merely used to describe particular embodiments, and are not intended to be limiting. An expression used in the singular encompasses the expression of the plural, unless it has a clearly different meaning in the context. In the present specification, it is to be understood that the terms such as "including", "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Like reference numerals in the drawings denote like elements. As used herein, the term "and/or" includes any and all combinations of one or more of the associated listed items. Expressions such as "at least one of" when preceding a list of elements, modify the entire list of elements and do not modify the individual elements of the list.

FIG. 1 illustrates an array substrate 100 for a flexible display device according to an embodiment.

Referring to FIG. 1, the array substrate 100 includes a mother substrate 110, a plurality of individual display units 120 formed on the mother substrate 110, encapsulation units 130 formed on the display units 120, and a plurality of testing wires 160 that are patterned on the mother substrate 110.

The mother substrate 110 may be a flexible substrate, such as a protective film formed of a polymer resin. The mother substrate 110 has a sufficient thickness to support a shape of the display units 120 that are thin-film layers. The mother substrate 110 is arranged to simultaneously manufacture the display units 120.

The display units 120 are arrayed at regular intervals on the mother substrate 110. The display units 120 are individually separable to function as display devices, respectively. The display units 120 that are simultaneously formed on the mother substrate 110 may be individually separated by using a cutting tool.

In the present embodiment, each of the display units 120 corresponds to an organic light-emitting display unit, but a display unit 120 may also be applied to different types of display units such as a liquid crystal display (LCD) unit, a field emission display unit, an electroluminescent display unit, an electrophoretic display unit, and the like.

The display unit 120 is divided into a display region 121 that realizes an image, and a non-display region 122 that extends from the display region 121 to edges of the display unit 120. Devices or thin-film layers formed in the display region 121 will be described with reference to FIG. 2, in detail.

The encapsulation unit 130 that covers the display region 121 is formed on the display unit 120. The encapsulation unit 130 may reduce the possibility of and/or prevent exterior moisture or foreign substances from penetrating into the display region 121. According to one embodiment, the encapsulation unit 130 may be formed on an entire surface of the mother substrate 110. According to another embodiment, the encapsulation unit 130 may be selectively formed on corresponding regions of the display units 120, respectively. The encapsulation unit 130 may be formed via a deposition process using a deposition mask.

The testing wires 160 are patterned in wire regions 140 between the display units 120 that are adjacent to each other. The testing wires 160 are electrically connected to the display units 120 so as to test whether the display units 120 normally operate.

Figure 2:
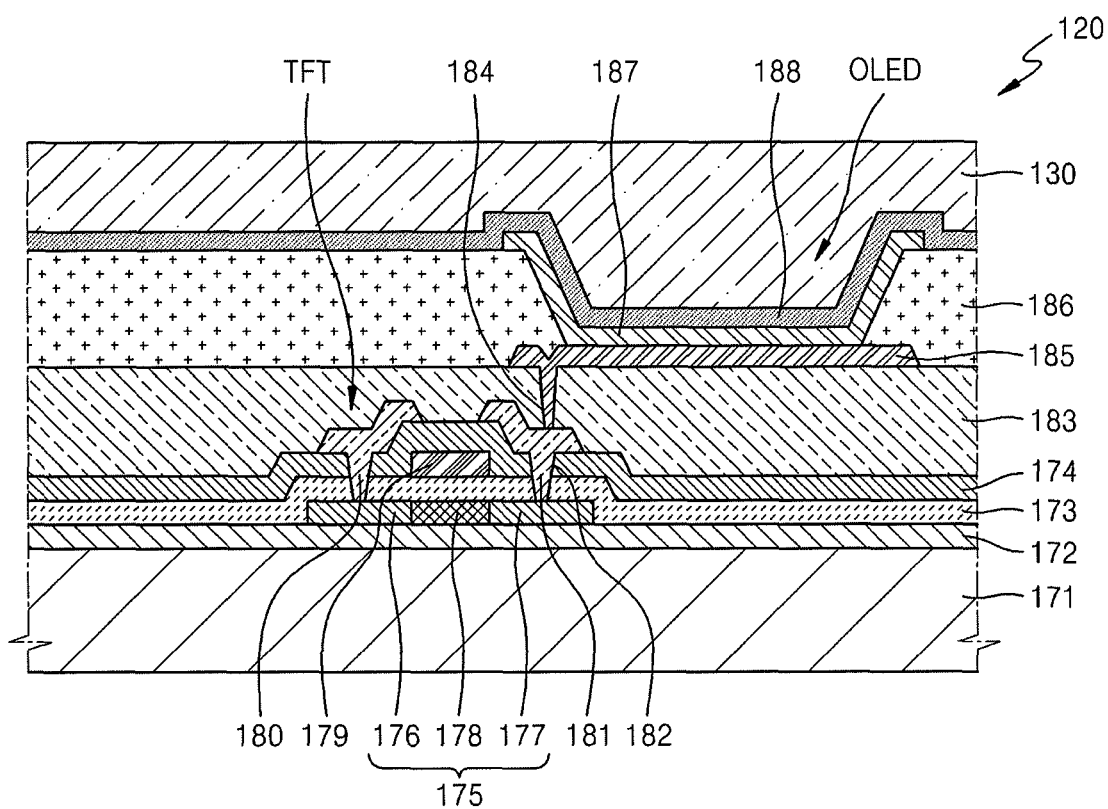
FIG. 2 is a cross-sectional view illustrating an exemplary sub-pixel of a display unit of FIG. 1.

FIG. 2 is a cross-sectional view illustrating a sub-pixel of the display unit 120 of FIG. 1.

Referring to FIG. 2, the display unit 120 includes a flexible substrate 171. The flexible substrate 171 may be formed of a flexible material. For example, the flexible substrate 171 may be formed of a polymer material including at least one selected from the group of polyimide (PI), polycarbonate (PC), polyethersulfone (PES), polyethylene terephthalate (PET), polyethylene naphthalate (PEN), polyarylate (PAR), fiber glass reinforced plastic (FRP), and the like.

In the present embodiment, the flexible substrate 171 is a thin-film layer that completely covers the mother substrate 110 of FIG. 1. According to another embodiment, if the flexible substrate 171 has a sufficient thickness to support weights of devices and thin-film layers which are formed thereon, the flexible substrate 171 may replace the mother substrate 110.

A first insulating layer 172 that corresponds to a barrier layer is formed on the flexible substrate 171. The first insulating layer 172 completely covers the flexible substrate 171. The first insulating layer 172 may include an inorganic material (e.g., at least one selected from the group of silicon oxide ($SiO_x$), silicon nitride ($SiN_x$), silicon oxynitride (SiON), aluminum oxide (AlO), aluminum nitride (AlON), and the like), may include an organic material (e.g., at least one selected from the group of acryl, polyimide, polyester, and the like), or may be formed as a multi-layer stack including the organic material and the inorganic material.

The first insulating layer 172 shields from oxygen and moisture, reduces the possibility of and/or prevents moisture or foreign substances from diffusing from the flexible substrate 171, and provides a flat surface on the flexible substrate 171.

A thin-film transistor (TFT) is formed on the first insulating layer 172. The TFT in the present embodiment is a top gate type TFT. However, the TFT may include different types of TFTs, such as a bottom gate type TFT.

If the TFT is a top gate type TFT as in the present embodiment, the first insulating layer 172 may be formed with a semiconductor active layer 175, a second insulating layer 173, a gate electrode 179, a third insulating layer 174, a source electrode 180, a drain electrode 181, and a protective layer 183 on the first insulating layer 172.

When the semiconductor active layer 175 is formed of polysilicon, the semiconductor active layer 175 may be formed in a manner that amorphous silicon is first formed and then is crystallized into polysilicon.

The crystallization of the amorphous silicon may be performed by using various methods including, e.g., a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like. For a device including the flexible substrate 171, a crystallization method that does not require a high-temperature heating process to be performed may be used.

For example, when the crystallization is performed via a low temperature polysilicon (LTPS) process, the semiconductor active layer 175 is activated by being irradiated a laser for a short time, so that the flexible substrate 171 is not exposed to a high temperature equal to or greater than 300° C. Thus, a whole process may be performed at a temperature equal to or less than 300° C. Accordingly, the TFT may be formed by using the flexible substrate 171 that is formed of a polymer material.

The semiconductor active layer 175 is formed with a source region 176 and a drain region 177, which are doped with p-type impurity ions. A channel region 178 that is not doped with an impurity corresponds to a region between the source region 176 and the drain region 177.

The second insulating layer 173 that corresponds to a gate insulating layer is formed on the semiconductor active layer 175. The second insulating layer 173 may be, e.g., a single layer including $SiO_2$ or may have a double-layer structure including $SiO_2$ and $SiN_x$. The second insulating layer 173 may correspond to an entire region of the display unit 120. For example, the second insulating layer 173 extends to and thus is formed in the non-display region 122 of FIG. 1. Also, the second insulating layer 173 may extend to the wire regions 140 of FIG. 1. In this manner, the second insulating layer 173 may be selectively formed on desired regions of the mother substrate 110 (refer to FIG. 1).

The gate electrode 179 is formed on a predetermined region of the second insulating layer 173. The gate electrode 179 is connected to a gate line (not shown) to apply TFT on/off signals to the TFT. The gate electrode 179 may be formed of a single metal material or metal materials. For example, the gate electrode 179 may include a single layer structure or a multi-layer structure including, e.g., at least one selected from the group of Au, Ag, Cu, Ni, Pt, Pd, Al, Mo, Cr, and the like, or may include a metal alloy, e.g., at least one selected from the group of an Al:Nd alloy, a Mo:W alloy, and the like.

The third insulating layer 174 that corresponds to an interlayer insulating layer is formed on the gate electrode 179. The third insulating layer 174 may be formed of an insulating material such as $SiO_2$ or $SiN_x$ or an insulating organic material. The third insulating layer 174 may correspond to an entire region of the display unit 120. For example, the third insulating layer 174 extends to and thus is formed in the non-display region 122 of FIG. 1.

In addition, the third insulating layer 174 may extend to the wire regions 140 of FIG. 1. In this manner, the third insulating layer 174 may be selectively formed on desired regions of the mother substrate 110.

Accordingly, in the non-display region 122 and the wire regions 140, the flexible substrate 171 is formed on the mother substrate 110, and at least one of the first insulating layer 172, the second insulating layer 173, and the third insulating layer 174 is stacked on the flexible substrate 171.

The source electrode 180 and the drain electrode 181 are formed on the third insulating layer 174. For example, by selectively removing the second insulating layer 173 and the third insulating layer 174, contact holes 182 are formed in the second insulating layer 173 and the third insulating layer 174. The source electrode 180 is electrically connected to the source region 176 via the contact hole 182, and the drain electrode 181 is electrically connected to the drain region 177 via another of the contact holes 182.

The protective layer 183 (i.e., a passivation layer and/or a planarization layer) is formed on the source electrode 180 and the drain electrode 181. The protective layer 183 protects and planarizes the TFT formed therebelow. The protective layer 183 may be formed in various manners. For example, the protective layer 183 may be formed of an organic material (such as benzocyclobutene (BCB), acryl, or the like) or an inorganic material (such as $SiN_x$ or the like) and may include one of various structures including a single-layer structure, a double-layer structure, or a multi-layer structure.

A display device is formed on the TFT. In the present embodiment, the display device is formed as an organic light-emitting device (OLED). However, embodiments are not limited thereto and thus various display devices may be used.

To form the OLED on the TFT, a first electrode 185 that corresponds to a pixel electrode is electrically connected to one of the source electrode 180 and the drain electrode 181 via a contact hole 184.

The first electrode 185 may function as an anode electrode between electrodes that are arranged in the OLED and may be formed of various conductive materials. The first electrode 185 may be formed as a transparent electrode or a reflective electrode according to purpose.

For example, when the first electrode 185 is used as a transparent electrode, the first electrode 185 may include, e.g., ITO, IZO, ZnO, $In_2O_3$, or the like. When the first electrode 185 is used as a reflective electrode, the first electrode 185 may be formed in a manner that a reflective layer is formed of, e.g., Ag, Mg, Al, Pt, Pd, Au, Ni, Nd, Ir, Cr, or compound of any of these, and then a transparent layer, e.g., of ITO, IZO, ZnO, $In_2O_3$, or the like, is formed thereon.

A pixel-defining layer (PDL) 186 that is formed of an organic material and covers edges of the first electrode 185 of the OLED is formed on the protective layer 183. An organic layer 187 is formed on an exposed portion of the first electrode 185, which is formed by etching a portion of the PDL 186.

In the present embodiment, the organic layer 187 is patterned to only correspond to each sub-pixel, i.e., the patterned first electrode 185. However, this structure is for convenience of description and thus the organic layer 187 may be integrally formed with another organic layer 187 of another adjacent sub-pixel. Alternatively, some layers of the organic layer 187 may be formed to correspond to sub-pixels, respectively, and other layers of the organic layer 187 may be integrally formed with another organic layer 187 of another adjacent sub-pixel.

The organic layer 187 may be formed of a low molecule organic material layer or a polymer organic material layer.

When the organic layer 187 is formed as a low molecule organic material layer, the organic layer 187 may have a structure in which a hole injection layer (HIL), a hole transport layer (HTL), an emission layer (EML), an electron transport layer (ETL), an electron injection layer (EIL), or the like are singularly or multiply stacked.

The organic layer 187 may be formed by using one of various organic materials including, e.g., copper phthalocyanine (CuPc), N,N'-Di(naphthalene-1-yl)-N,N'-diphenyl-benzidine (NPB), tris-8-hydroxyquinoline aluminum)(Alq3), or the like.

When the organic layer 187 is formed as a polymer organic material layer, the organic layer 187 may have a structure including an HTL and an EML. For example, the HTL is formed of PEDOT, and the EML is formed of a polymer organic material including, e.g., a poly-phenylenevinylene (PPV)-based material, a polyfluorene-based material, and the like. The polymer organic material layer may be formed by using a screen printing method, an inkjet printing method, or the like.

However, features of the organic layer 187 are not limited thereto and thus various examples may be applied thereto.

A second electrode 188 that corresponds to a common electrode of the OLED is formed on the organic layer 187.

The first electrode 185 and the second electrode 188 are insulated from each other by the organic layer 187. When a voltage is applied to the first electrode 185 and the second electrode 188, visible rays are emitted from the organic layer 187 so that an image that is recognizable by a user is realized.

Likewise to the first electrode 185, the second electrode 188 may be formed as a transparent electrode or a reflective electrode.

When the second electrode 188 is formed as a transparent electrode, the second electrode 188 may be formed in a manner that a metal material with a low work function, e.g., Li, Ca, LiF/Ca, LiF/Al, Al, Mg, or compound of any of these, is deposited on the organic layer 187, and then a transparent electrode target material, including ITO, IZO, ZnO, $In_2O_3$, or the like, is formed thereon.

When the second electrode 188 is formed as a reflective electrode, the second electrode 188 may be formed in a manner that Li, Ca, LiF/Ca, LiF/Al, Al, Mg, or compound of any of these, are completely deposited.

When the first electrode 185 is formed as a transparent electrode or a reflective electrode, the first electrode 185 may have a shape that corresponds to a shape of an opening of each sub-pixel. The second electrode 188 may be formed by depositing a transparent electrode or a reflective electrode on an entire surface of the display region 121. However, the second electrode 188 may not be deposited on the entire surface and thus may be formed as various patterns. Here, positions of the first electrode 185 and the second electrode 188 may be switched.

The encapsulation unit 130 is combined on the OLED. The encapsulation unit 130 is formed to protect the organic layer 187 and other thin-film layers against exterior moisture or oxygen. The encapsulation unit 130 may encapsulate the OLED in a manner that organic and/or inorganic films are formed on the OLED after the OLED is manufactured. Alternatively, the encapsulation unit 130 may be formed of the same material as the flexible substrate 171.

A buffer layer (not shown) may be further formed on one surface of the encapsulation unit 130 which faces the OLED. The buffer layer may be formed of an inorganic material, such as $SiO_x$, $SiN_x$, SiON, AlO, or AlON, may be formed of an organic material, such as acryl, polyimide, or the like, or may be formed as a multi-layer stack including the organic material and the inorganic material.

Referring back to FIG. 1, the display units 120 that are arrayed at regular intervals on the mother substrate 110 undergo a cutting process so as to be divided into individual display devices. The cutting may occur in an area outside of the individual display units 120 and between adjacent ones of the individual display units 120.

For the division, cutting lines 151 and 152 are formed on the mother substrate 110 so that the display units 120 are individually separated along edges of the display units 120. The cutting lines 151 and 152 include a plurality of first cutting lines 151 that are formed along opposite edges of the display units 120 in an X-axis direction of the array substrate 100, and a plurality of second cutting lines 152 that are formed along opposite edges of the display units 120 in an Y-axis direction of the array substrate 100.

By using a cutting tool, the array substrate 100 having the aforementioned structure is cut along the first cutting lines 151 so that a group of the display units 120 sequentially arrayed in the X-axis direction is separated. Then, the group of display units 120 are cut along the second cutting lines 152 so that the display units 120 are individually separated.

The testing wires 160 are patterned in the wire region 140 between the adjacent display units 120. When the testing wires 160 are located on the first and second cutting lines 151 and 152 on the array substrate 100, because the wire region 140 is narrow, the testing wires 160 may be torn while the cutting tool cuts through the testing wires 160 from a vertical direction, e.g., from above the array substrate 100. When the testing wire 160 is torn, a minute crack may occur.

The crack may propagate toward a region in which the display unit 120 is arranged, thereby possibly causing damage to a device and/or thin-film layers formed in the display unit 120. The damage to the device and/or thin-film layers causes a defect, such as shrinkage of the display unit 120. For example, when damage occurs in the encapsulation unit 130, which covers the display region 121 including an active area of the display unit 120, the shrinkage of the display unit 120 rapidly occurs. Thus, the defect of the crack occurs in the display unit 120.

In order to reduce the possibility of and/or prevent the aforementioned defects, according to the present embodiment, a crack preventing unit 190 is formed along edges of the display unit 120.

This is described in detail.

Figure 3:
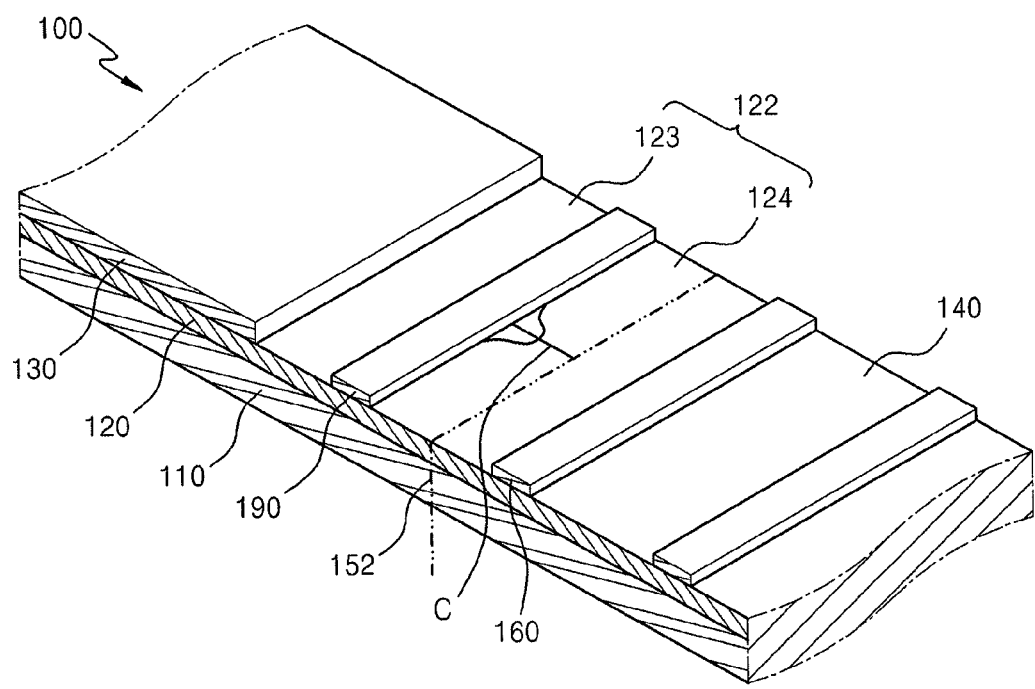
FIG. 3 is a magnified perspective view illustrating a portion of an array substrate of FIG. 1, which is cut along a first cutting line.

FIG. 3 is a magnified perspective view illustrating a portion of the array substrate 100 of FIG. 1, which is cut along the second cutting line 152.

While an example of FIG. 3 corresponds to a case of cutting along the second cutting line 152. However, the example of FIG. 3 may be equally applied to a case of cutting along the first cutting line 151.

Referring to FIG. 3, in the array substrate 100, the display unit 120 is formed on the mother substrate 110. A display region (refer to the display region 121 of FIG. 1) of the display unit 120 is covered by the encapsulation unit 130, and the non-display region 122 that is not covered by the encapsulation unit 130 extends from an edge of the encapsulation unit 130 toward an edge of the display unit 120. The wire region 140 is formed between the adjacent display units 120.

As described above with reference to FIGS. 1 and 2, a flexible substrate (refer to the flexible substrate 171 of FIG. 2) included in the display unit 120 is formed as a thin-film layer that is completely deposited on the mother substrate 110, and insulating layers, such as the first insulating layer 172 corresponding to a barrier layer, the second insulating layer 173 corresponding to a gate insulating layer, the third insulating layer 174 corresponding to an interlayer insulating layer, or the like, are formed in the display region 121. Here, if the flexible substrate 171 has a desired thickness, the flexible substrate 171 may replace the mother substrate 110.

At least one insulating layer that is selected from the first insulating layer 172, the second insulating layer 173, and the third insulating layer 174 on the mother substrate 110 and that extends from the display region 121 is formed in the non-display region 122. Also, the same insulating layer may be formed in the wire region 140 between the adjacent display units 120.

To individually separate the display units 120, the first and second cutting lines 151 and 152 (refer to FIG. 1) are formed along edges of the display units 120. When a cutting tool passes through the first and second cutting lines 151 and 152 in a vertical direction with respect to the array substrate 100, the display units 120 may be separated into individual units.

Here, the testing wire 160 is patterned in the wire region 140 between the adjacent display units 120. The testing wire 160 is not located on the first and second cutting lines 151 and 152. That is, the testing wire 160 is formed away from the display unit 120 with respect to the second cutting line 152 in FIG. 3.

In order to prevent an edge crack of the display unit 120 from propagating toward the encapsulation units 130, the crack preventing unit 190 is formed in the non-display region 122, and the edge crack occurs because the array substrate 100 is bent when a cutting tool passes through the first and second cutting lines 151 and 152.

The crack preventing unit 190 is formed in the non-display region 122 of the display unit 120, which corresponds to a region between an edge of the display unit 120 and an edge of the encapsulation units 130. The crack preventing unit 190 is patterned in the non-display region 122 of the display unit 120 while the crack preventing unit 190 surrounds the encapsulation units 130. For example, the crack preventing unit 190 may completely enclose lateral sides of one encapsulation unit 130 therein while being spaced apart from a periphery of the one encapsulation unit 130.

In the present embodiment, the crack preventing unit 190 is formed in a central region of the non-display region 122. Accordingly, the non-display region 122 is partitioned into a first non-display region 123 between the edge of the encapsulation units 130 and the crack preventing unit 190, and a second non-display region 124 between the edge of the display unit 120 and the crack preventing unit 190. The edges of the display unit 120 correspond to the first and second cutting lines 151 and 152.

Because the crack preventing unit 190 and the first non-display region 123 are arranged in the aforementioned manner, when the array substrate 100 is cut along the second cutting lines 152 by using the cutting tool, a center of a physical force by the cutting tool may be moved to the crack preventing unit 190. Accordingly, a crack does not occur in the first non-display region 123. On the other hand, if the crack preventing unit 190 is not formed, the center of the physical force by the cutting tool corresponds to the edge of the encapsulation units 130.

The crack preventing unit 190 is formed as a single continuous straight line, e.g., a closed loop shape, around the encapsulation units 130. According to another embodiment, the crack preventing unit 190 may be formed as a plurality of continuous straight lines that are separated from each other, may be formed as a single continuous curved line, or may be formed as a plurality of continuous curved lines that are separated from each other.

The crack preventing unit 190 may be formed as a single intermittent straight line, may be formed as a plurality of intermittent curved lines that are separated from each other along the encapsulation units 130, or may be formed as a plurality of intermittent curved lines that overlap with each other along the encapsulation units 130, and features of the crack preventing unit 190 are not limited thereto.

The crack preventing unit 190 may be formed of any material capable of preventing the edge crack that occurs when the display unit 120 is cut along the first and second cutting lines 151 and 152. For example, the material that forms the crack preventing unit 190 may include conductive materials, such as at least one selected from the group of Au, Ag, Cu, Ni, Pt, Pd, Al, Mo, Cr, and the like.

According to an exemplary embodiment, the crack preventing unit 190 may be formed in the same process in which electrodes such as the gate electrode 179, the source electrode 180, the drain electrode 181, and the like are formed in the display region 121. For example, the crack preventing unit 190 may formed together with the testing wire 160.

As described above, since the first and second cutting lines 151 and 152 are formed between the crack preventing unit 190 and the testing wires 160, when the display units 120 are individually separated by using the cutting tool, it is possible to prevent damage to the testing wires 160 so that an occurrence of an edge crack due to a tear of the testing wires 160 may be maximally decreased.

Figure 4:
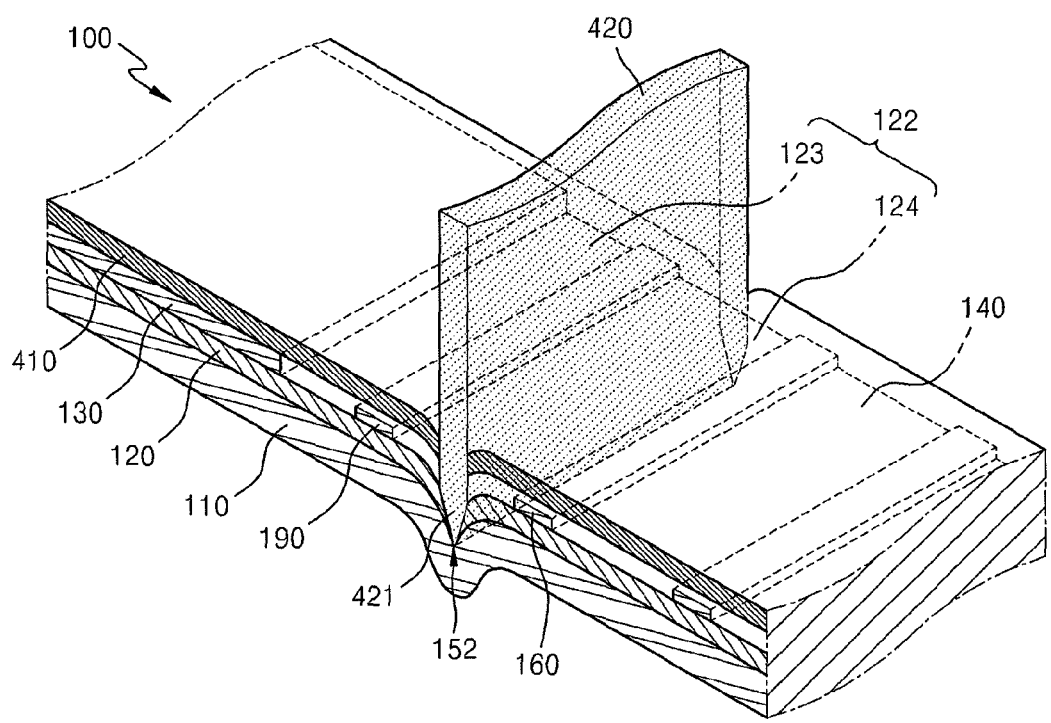
FIG. 4 is a magnified perspective view illustrating a cut status of an array substrate of FIG. 3.

FIG. 4 illustrates a cut status of the array substrate 100 of FIG. 3.

Here, the array substrate 100 has already been cut along the first cutting line 151 and then is now being cut along the second cutting line 152 so as to be divided into the display units 120.

Referring to FIG. 4, the array substrate 100 includes the mother substrate 110, the display unit 120 that is formed on the mother substrate 110, the encapsulation unit 130 that covers a display region (refer to the display region 121 of FIG. 1) of the display unit 120, the testing wire 160 that is formed in the wire region 140 between the adjacent display units 120, the crack preventing unit 190 that is formed between an edge of the encapsulation unit 130 and an edge of the display unit 120 which corresponds to the second cutting line 152, and a protective film 410 that is formed on the encapsulation unit 130.

The mother substrate 110 functions as a lower protective film to support the flexible substrate 171 that is a thin-film layer included in the display unit 120, and may be formed as a single layer if the flexible substrate 171 has a desired thickness. The mother substrate 110 is formed of a flexible material.

Also, at least one of a plurality of insulating layers including the first insulating layer 172, the second insulating layer 173, and the third insulating layer 174 which extend from the display region 121 of the display unit 120 is formed in the non-display region 122 or the wire region 140 of the display unit 120.

The protective film 410 functions as an upper protective film to prevent the display unit 120 from being damaged when the display unit 120 is cut by using a cutting tool 420. The protective film 410 may be formed of a polymer film having flexibility. The protective film 410 covers all of the display unit 120, the encapsulation unit 130, the testing wire 160, and the crack preventing unit 190.

Here, the second cutting line 152 is arranged along the edge of the display unit 120 between the crack preventing unit 190 and the testing wire 160. The cutting tool 420 is positioned on the second cutting line 152 and then descends from an upper part of the array substrate 100 to pass through the second cutting line 152.

When an end 421 of the cutting tool 420 contacts the array substrate 100, the array substrate 100 is downwardly bent at the second cutting line 152 due to a physical force by the cutting tool 420.

Since the encapsulation unit 130 is interposed between the display unit 120 and the protective film 410, the display unit 120 and the protective film 410 do not contact each other at the second cutting line 152 in which the encapsulation unit 130 does not exist.

When the crack preventing unit 190 is not formed, the edge of the encapsulation unit 130 is located at a center of the physical force. Thus, an edge crack that occurs from the second cutting line 152 during a cutting operation by the cutting tool 420 propagates to the edge of the encapsulation unit 130.

On the other hand, in the present embodiment, the crack preventing unit 190 is formed in the non-display region 122 between the encapsulation unit 130 and the second cutting line 152, so that the center of the physical force by the end 421 of the cutting tool 420 may be moved from the edge of the encapsulation unit 130 to the crack preventing unit 190.

Therefore, the crack preventing unit 190 prevents the edge crack, which occurs from the second cutting line 152, from propagating to a region of the encapsulation unit 130, and the first non-display region 123 between the edge of the encapsulation unit 130 and the crack preventing unit 190 becomes a region in which a crack does not occur.

Figure 5:
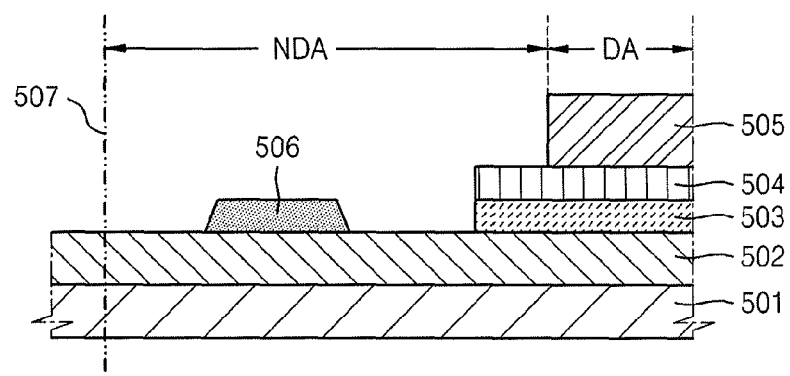
FIG. 5 is a cross-sectional view illustrating a crack preventing unit according to an exemplary embodiment.

FIG. 5 illustrates a crack preventing unit 506 according to an embodiment.

Hereinafter, a location of the crack preventing unit 506 with respect to each of insulating layers that extend from a display region formed on a mother substrate, and in this regard, descriptions about the mother substrate, or devices that are insulated from each other by the insulating layers in the display region are not provided here.

Referring to FIG. 5, a first insulating layer 502 that corresponds to a barrier layer, a second insulating layer 503 that corresponds to a gate insulating layer, and a third insulating layer 504 that corresponds to an interlayer insulating layer are stacked on a flexible substrate 501. An encapsulation unit 505 is formed on the third insulating layer 504 so as to protect a device in a display region DA. Here, the first insulating layer 502 is formed on an entire surface of the flexible substrate 501.

Here, the crack preventing unit 506 is formed in the non-display region NDA between the encapsulation unit 505 and a cutting line 507. The crack preventing unit 506 is formed on a top surface of the first insulating layer 502. In a manufacturing method, the crack preventing unit 506 may be formed in the same process that a gate electrode (not shown) is formed on the second insulating layer 503 in the display region DA, by using the same material as the gate electrode.

Figure 6:
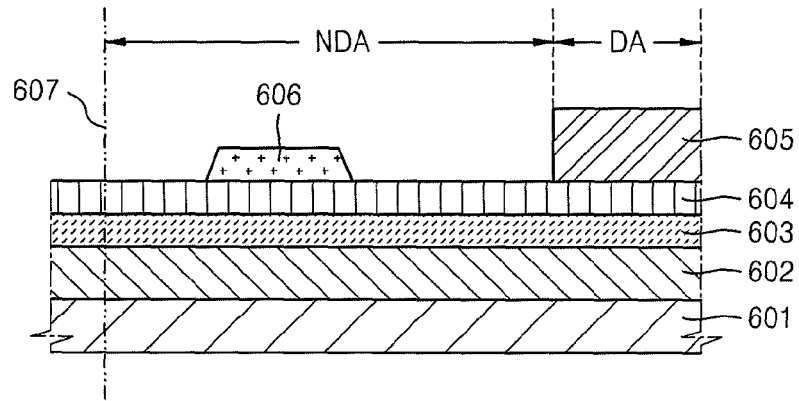
FIG. 6 is a cross-sectional view illustrating a crack preventing unit according to an exemplary embodiment.

FIG. 6 illustrates a crack preventing unit 606 according to another embodiment.

Referring to FIG. 6, a first insulating layer 602 that corresponds to a barrier layer, a second insulating layer 603 that corresponds to a gate insulating layer, and a third insulating layer 604 that corresponds to an interlayer insulating layer are stacked on a flexible substrate 601. An encapsulation unit 605 is formed on the third insulating layer 604 so as to protect a device in a display region DA. The first insulating layer 602, the second insulating layer 603, and the third insulating layer 604 extend together from the display region DA toward another region on the flexible substrate 601.

The crack preventing unit 606 is formed in a non-display region NDA between the encapsulation unit 605 and a cutting line 607. The crack preventing unit 606 is formed on a top surface of the third insulating layer 604. In a manufacturing method, the crack preventing unit 606 is formed in the same process that a source electrode or a drain electrode (not shown) is formed on the third insulating layer 604 in the display region DA, by using the same material as the source electrode or the drain electrode.

Figure 7:
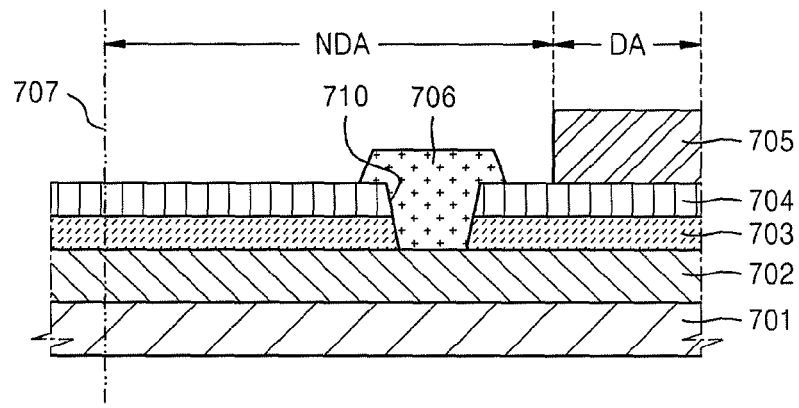
FIG. 7 is a cross-sectional view illustrating a crack preventing unit according to an exemplary embodiment.

FIG. 7 illustrates a crack preventing unit 706 according to another embodiment.

Referring to FIG. 7, a first insulating layer 702 that corresponds to a barrier layer, a second insulating layer 703 that corresponds to a gate insulating layer, and a third insulating layer 704 that corresponds to an interlayer insulating layer are stacked on a flexible substrate 701. An encapsulation unit 705 is formed on the third insulating layer 704 so as to protect a device in a display region DA. The first insulating layer 702, the second insulating layer 703, and the third insulating layer 704 extend together from the display region DA toward another region on the flexible substrate 701.

The crack preventing unit 706 is formed in a non-display region NDA between the encapsulation unit 705 and a cutting line 707. A portion of the second insulating layer 703 and a portion of the third insulating layer 704 are removed to form a contact hole 710 in the non-display region NDA. The crack preventing unit 706 fills the contact hole 710. The crack preventing unit 706 is formed in the same process that a source electrode or a drain electrode (not shown) is formed on the third insulating layer 704 in the display region DA, by using the same material as the source electrode or the drain electrode.

Figure 8:
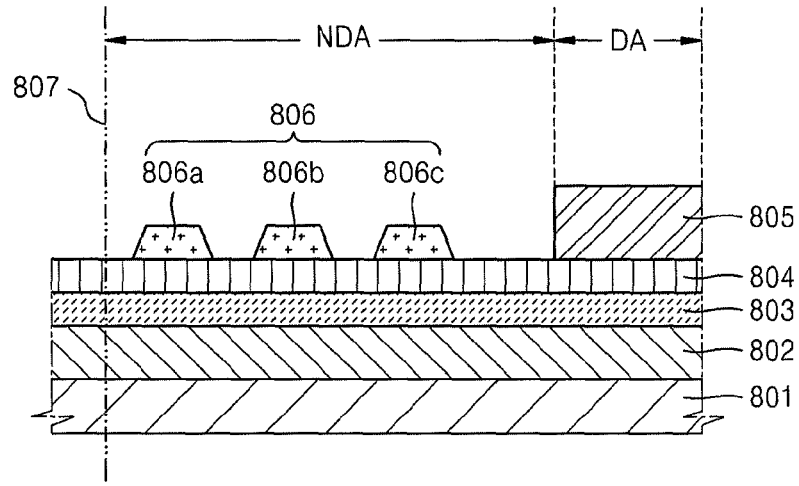
FIG. 8 is a cross-sectional view illustrating a crack preventing unit according to an exemplary embodiment.

FIG. 8 illustrates a crack preventing unit 806 according to another embodiment.

Referring to FIG. 8, a first insulating layer 802 that corresponds to a barrier layer, a second insulating layer 803 that corresponds to a gate insulating layer, and a third insulating layer 804 that corresponds to an interlayer insulating layer are stacked on a flexible substrate 801. An encapsulation unit 805 is formed on the third insulating layer 804 so as to protect a device in a display region DA. The first insulating layer 802, the second insulating layer 803, and the third insulating layer 804 extend together from the display region DA toward another region on the flexible substrate 801.

The crack preventing unit 806 is formed in a non-display region NDA between the encapsulation unit 805 and a cutting line 807. The crack preventing unit 806 is formed on a top surface of the third insulating layer 804. In a manufacturing method, the crack preventing unit 806 is formed in the same process that a source electrode or a drain electrode (not shown) is formed on the third insulating layer 804 in the display region DA, by using the same material as the source electrode or the drain electrode.

The crack preventing unit 806 may be formed as a single line that surrounds the encapsulation unit 805 in the non-display region NDA. In the present embodiment, the crack preventing unit 806 includes a first crack preventing unit 806a, a second crack preventing unit 806b, and a third crack preventing unit 806c that are separated from each other.

Accordingly, although an edge crack is incurred due to a cutting operation at the cutting line 807, since the first crack preventing unit 806a, the second crack preventing unit 806b, and the third crack preventing unit 806c are separated from each other, propagation of the edge crack may be further efficiently prevented.

By way of summation and review, among the flat display devices, organic light-emitting display devices have wide viewing angles, an excellent contrast ratio, and high response speeds. The organic light-emitting display devices are highlighted for being applied to display devices for mobile devices, such as a digital camera, a video camera, a camcorder, a portable information terminal, a smart phone, an ultra-slim notebook, a table personal computer, or the like, or electronic/electric appliances, such as ultra-thin TVs.

Recently, flexible display devices have been developed as a next-generation display device to be applied to portable and various-shaped devices. Among the flexible display devices, a flexible display device based on organic light-emitting display technology is a strong candidate to be a next-generation display device.

For convenience in a manufacturing method, a flexible display device may be produced by forming a plurality of display devices on a large substrate and cutting the plurality of display devices into individual display devices with a cutting tool. Here, a plurality of testing wires that are electrically connected to the display devices, respectively, may be formed on the large substrate to perform a lighting test on the individual display devices. When the large substrate is cut after the lighting test is completed, cracks may be incurred (e.g., because the testing wires are torn by a force applied from the cutting tool) that cause shrinkage of the display devices.

In contrast, embodiments relate to an array substrate for a flexible display device in which cracks may be avoided when the array substrate is cut into a plurality of display devices. Embodiments also relate to an array substrate for a flexible display device, which may avoid having cracks that occur on a large substrate when a plurality of flexible display devices formed on the large substrate are individually cut, whereby shrinkage of the separated flexible display devices may also be decreased.

As described above, on the array substrate for a flexible display device according to the one or more embodiments, a testing wire that is formed on a mother substrate does not overlap with a cutting line that is formed at the edge of a display unit, so that it is possible to reduce the possibility of and/or prevent the occurrence of a crack. Also, since a crack preventing unit is formed in a region between the edge of an encapsulation unit and the edge of the display unit, it is possible to reduce the possibility of and/or prevent cracks from occurring in the mother substrate and from propagating to ones of the individual display devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims

What is claimed is:

1. An array substrate for a flexible display device, the array substrate comprising:
   a mother substrate;
   a plurality of display units separated on the mother substrate, the plurality of display units including display regions that display images and non-display regions that extend from the display regions to edges of the plurality of display units, respectively;
   encapsulation units covering the display regions of the plurality of display units, respectively;
   a plurality of testing wires in a wire region between adjacent display units from among the plurality of display units, the plurality of testing wires being electrically connected to each of the plurality of display units; and
   crack preventing units formed of a conductive material in the non-display regions between edges of the encapsulation units and the edges of the plurality of display units, respectively, wherein
   the crack preventing units are electrically isolated.

2. The array substrate of claim 1, wherein the crack preventing units are formed in the non-display regions and surround the encapsulation units, respectively.

3. The array substrate of claim 2, wherein the non-display regions include:
   first non-display regions between edges of the encapsulation units and the crack preventing units, respectively, and
   second non-display regions between the crack preventing units and the edges of the plurality of display units, respectively.

4. The array substrate of claim 2, wherein the crack preventing units are each formed as at least one continuous straight line, at least one continuous curved line, a plurality of intermittent straight lines that are separated from each other or overlap with each other, or a plurality of intermittent curved lines that are separated from each other or overlap with each other.

5. The array substrate of claim 2, further comprising a plurality of cutting lines on the mother substrate, the plurality of cutting lines being arranged so as to individually divide the plurality of display units along the edges of the plurality of display units and so as to correspond to the edges of the plurality of display units.

6. The array substrate of claim 5, wherein the plurality of cutting lines are separated from the plurality of testing wires.

7. The array substrate of claim 1, wherein the mother substrate is formed of a flexible material.

8. The array substrate of claim 1, further comprising a protective film that covers each of the plurality of display units, the encapsulation units, the plurality of testing wires, and the crack preventing units on the mother substrate.

9. The array substrate of claim 1, wherein each of the plurality of display units includes:
   a flexible substrate,
   a thin-film transistor (TFT) on the flexible substrate, the TFT including a semiconductor active layer, a gate electrode, source and drain electrodes, and a plurality of insulating layers that insulate the gate electrode, the source and drain electrodes, and the semiconductor active layer, and
   an organic light-emitting device (OLED) that is connected to the TFT, the OLED including a first electrode, a second electrode, and an organic layer between the first electrode and the second electrode.

10. The array substrate of claim 9, wherein one of the crack preventing units is on at least one insulating layer from among the plurality of insulating layers.

11. The array substrate of claim 9, further comprising a plurality of cutting lines near the edges of the plurality of display units so as to individually divide the plurality of display units, the plurality of cutting lines being between the crack preventing units and the plurality of testing wires.

12. The array substrate of claim 9, wherein the plurality of insulating layers include:

a first insulating layer corresponding to a buffer layer on the flexible substrate;

a second insulating layer corresponding to a gate insulating layer that covers the semiconductor active layer formed on the first insulating layer; and a third insulating layer corresponding to an interlayer insulating layer that covers the gate electrode formed on the second insulating layer.

13. The array substrate of claim 12, wherein the gate electrode is in a display region of the second insulating layer, and one of the crack preventing units is in a non-display region of the second insulating layer between one of the encapsulation units and a plurality of cutting lines.

14. The array substrate of claim 12, wherein the source and drain electrodes are in a display region of the third insulating layer, and one of the crack preventing units is in a non-display region of the third insulating layer between one of the encapsulation units and a plurality of cutting lines.

15. The array substrate of claim 12, wherein the source and drain electrodes are in a display region of the third insulating layer, and one of the crack preventing units is in a non-display region of the third insulating layer between one of the encapsulation units and a plurality of cutting lines, so as to fill a contact hole that penetrates through the second insulating layer and the third insulating layer.

16. The array substrate of claim 1, wherein the crack preventing units are spaced apart from the edges of the encapsulation units.

17. An array substrate for a flexible display device, the array substrate comprising:

a flexible substrate;

a plurality of display units separated on the flexible substrate, the plurality of display units including display regions that are covered by encapsulation units and that display images, respectively, and including non-display regions that extend from the display regions, respectively;

a plurality of testing wires in a wire region between adjacent display units from among the plurality of display units, the plurality of testing wires being electrically connected to each of the plurality of display units;

crack preventing units formed of a conductive material in the non-display regions of the plurality of display units, respectively, the crack preventing units being between edges of the encapsulation units and edges of the plurality of display units, respectively; and a plurality of cutting lines between the crack preventing units and the plurality of testing wires so as to individually divide the plurality of display units, wherein the crack preventing units are electrically isolated.

* * * * *